United States Patent [19]

Soper

[11] Patent Number: 5,678,304
[45] Date of Patent: Oct. 21, 1997

[54] METHOD FOR MANUFACTURING DOUBLE-SIDED CIRCUIT ASSEMBLIES

[75] Inventor: Jay B. Soper, Rochester, N.Y.

[73] Assignee: Eastman Kodak Company, Rochester, N.Y.

[21] Appl. No.: 686,081

[22] Filed: Jul. 24, 1996

[51] Int. Cl.$^6$ .................................................. H05K 3/34
[52] U.S. Cl. ........................................ 29/840; 228/180.21
[58] Field of Search ...................... 24/832, 840, 740; 228/180.21

[56] References Cited

U.S. PATENT DOCUMENTS

| | | | |
|---|---|---|---|
| 4,515,304 | 5/1985 | Berger | 228/180.21 |
| 4,711,804 | 12/1987 | Burgess | 29/840 |
| 4,761,881 | 8/1988 | Bora et al. | 29/840 |
| 4,841,633 | 6/1989 | Kinugawa | 29/840 |
| 5,167,361 | 12/1992 | Liebman et al. | 228/180.2 |
| 5,215,244 | 6/1993 | Buchholz et al. | 228/122 |
| 5,242,103 | 9/1993 | Denvir | 228/179.1 |
| 5,261,989 | 11/1993 | Ueltzen | 156/252 |
| 5,342,208 | 8/1994 | Kobayashi et al. | 439/79 |
| 5,373,984 | 12/1994 | Wentworth | 228/180.21 |
| 5,394,609 | 3/1995 | Ferguson et al. | 228/180.21 |
| 5,402,563 | 4/1995 | Satah et al. | 29/829 |
| 5,456,402 | 10/1995 | Curtin | 228/43 |

OTHER PUBLICATIONS

*Electronic Equipment Packaging Technology*, by G.L. Ginsberg. New York: Van Nostrand Reinhold, 1991, pp. 603–615.

Primary Examiner—P. W. Echols
Assistant Examiner—Adrian L. Coley
Attorney, Agent, or Firm—David M. Woods

[57] ABSTRACT

A method for manufacturing double-sided circuit assemblies by a surface mount process includes the steps of: arranging the circuit assemblies in arrays so that two or more circuit assemblies, at least one top side up and at least one bottom side up, are provided in each array; populating one side of the circuit assemblies in a first pass of the arrays through the surface mount process; flipping each array over; and populating the other side of the circuit assemblies in a second pass of the flipped arrays through the same surface mount process with no changes in stencil, placement program, or components.

8 Claims, 2 Drawing Sheets

METHOD FOR MANUFACTURING DOUBLE-SIDED CIRCUIT ASSEMBLIES

FIELD OF THE INVENTION

The invention pertains to the manufacture of packaged electronic component assemblies, in particular by the use of surface mount technology (SMT).

BACKGROUND OF THE INVENTION

Surface mount technology (SMT) terminates packaged circuit components in a planar manner on the surface of a printed wiring board, e.g., a printed circuit board. The circuit board includes a conductive land pattern that is intended for the mounting, interconnection, and testing of integrated circuit packages that are arrayed on the land pattern. SMT itself is the production line process for applying a solder paste to the circuit board substrate, placing the circuit packages on the land pattern, and generating (reflowing) the solder connections. There are several different ways to process surface mount board assemblies. Basically, the differences pertain to the use of SMT components on one (single-sided) or both (double-sided) sides of the assembly.

In the manufacture of double-sided SMT circuit boards, the SMT process requires running the boards through the SMT production line in a first pass to process a first (primary) side of the boards, and then changing the line over to run the other (secondary) side of the boards through the process in a second pass. During each pass, the corresponding side of each board is populated with electronic components. This process, however, is costly due to the downtime during changeover, and further increases the risk of defects caused by a new setup. Moreover, in a high volume manufacturing environment characterized by a continuous board flow, constant quality feedback from the process is desired as well. This feedback is typically provided when the boards are incorporated into larger assemblies (e.g., end products) and tested. Changing the line between passes requires batching the boards and consequently interrupts flow and delays feedback until a batch is finished.

The typical approach to these problems is to have two complete SMT lines and a board flipper between the lines. The second SMT line is then set up to do the reverse side of the boards. A second SMT line, however, typically adds millions of dollars to the machinery cost, as well as requiring a larger area on the factory floor. Particularly in smaller production situations, a second line is undesirable.

SUMMARY OF THE INVENTION

The present invention is directed to overcoming one or more of the problems set forth above. Briefly summarized, according to one aspect of the present invention, a method for manufacturing double-sided circuit assemblies by a surface mount process includes the steps of: arranging the circuit assemblies in arrays so that two or more circuit assemblies, at least one top side up and at least one bottom side up, are provided in each array; populating one side of the circuit assemblies in a first pass of the arrays through the surface mount process; flipping each array over; and populating the other side of the circuit assemblies in a second pass of the flipped arrays through the same surface mount process.

The advantage of the invention is that it avoids changeover of a surface mount production line to do another side of each circuit assembly (e.g., circuit board), that is, the invention avoids changing the stencil that produces a solder paste pattern, changing the parts that are applied to the boards, and changing the program for populating the boards. Instead, the stencil, parts and program remain the same for both sides of the boards. Furthermore, this process can be designed to avoid batching and instead create a flow of finished boards off the production line. The flow in turn reduces production cycle time and provides faster quality feedback as finished boards are incorporated into product.

These and other aspects, objects, features and advantages of the present invention will be more clearly understood and appreciated from a review of the following detailed description of the preferred embodiments and appended claims, and by reference to the accompanying drawings.

DETAILED DESCRIPTION OF THE INVENTION

Because packaged-component assembly technologies, including surface mount technology, are well known, the present description will be directed in particular to elements forming part of, or cooperating more directly with, method and apparatus in accordance with the present invention. Elements or methodology not specifically shown or described herein may be selected from such material as known in the art.

Certain aspects of the operation to be described may be provided in software. All such software implementation is well-known and conventional, and within the ordinary skill in such arts.

Figure 1:
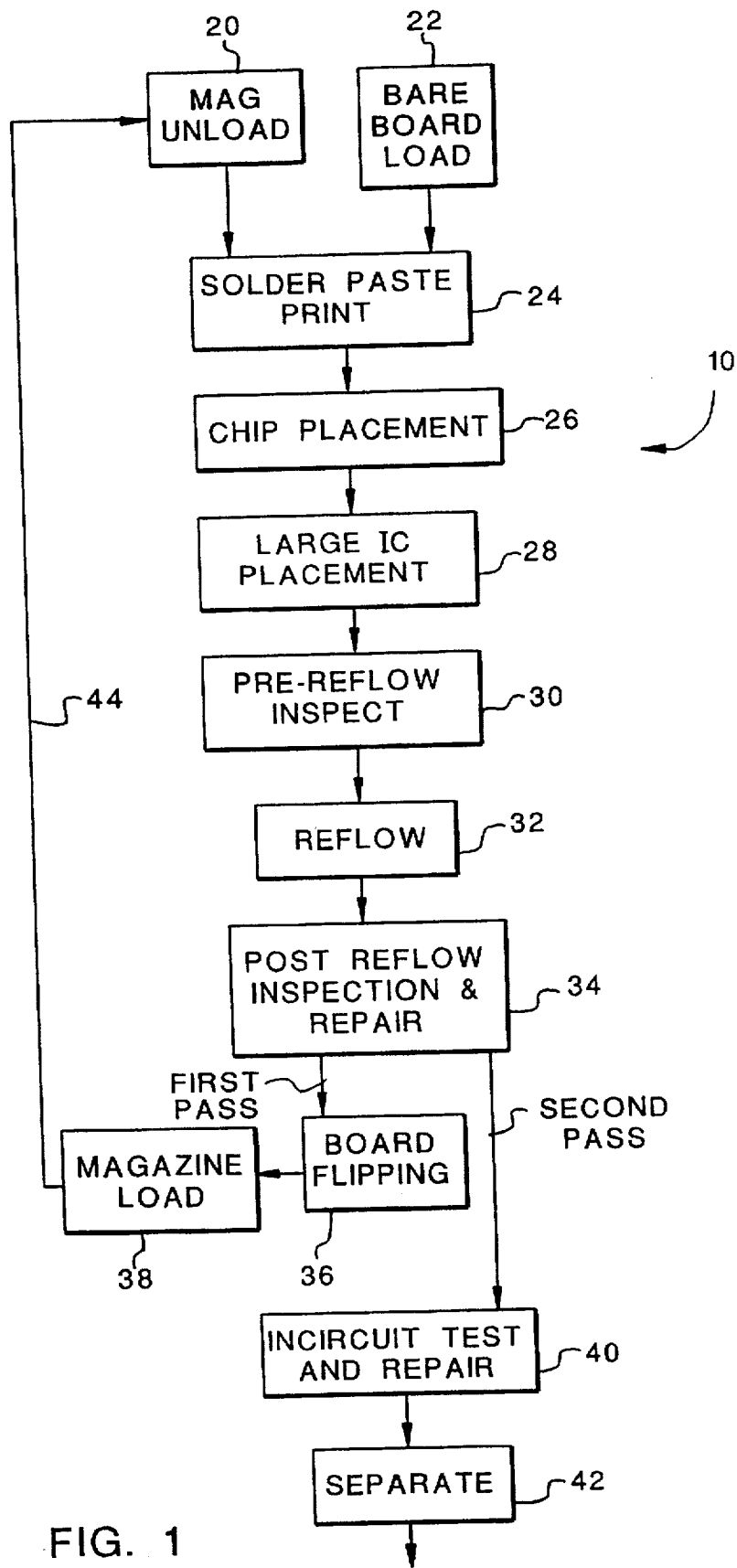
FIG. 1 is a schematic diagram of an SMT production line arranged according to the invention.
Figures 2A, 2B:
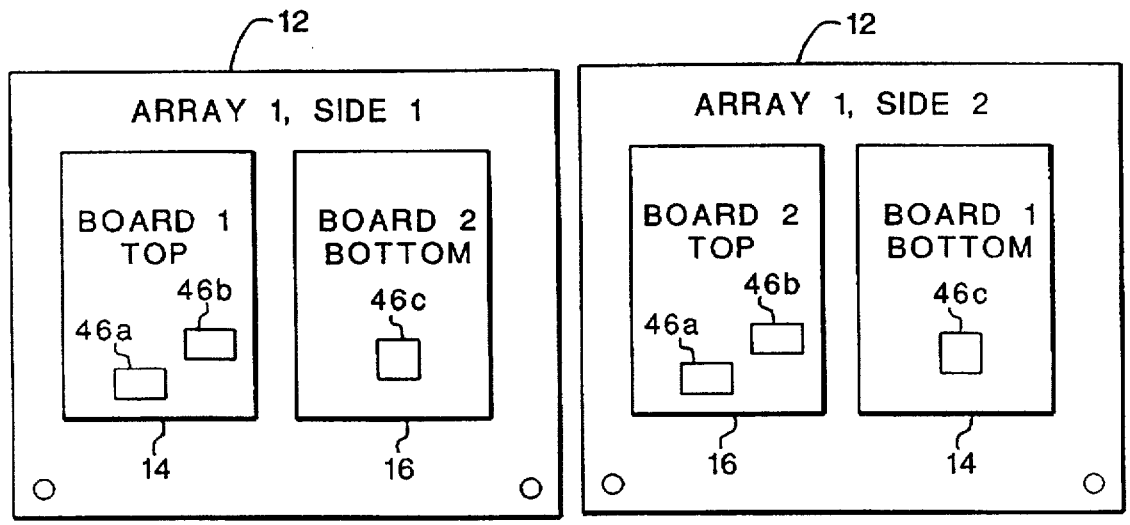
FIGS. 2(A) and 2(B) are views of respective sides of an array supporting two circuit boards, one face up and other face down.

FIG. 1 shows an SMT production line 10 arranged according to the invention to populate both sides of circuit assemblies with circuit components. As shown here and described, the circuit assemblies are printed wiring or circuit boards. The circuit boards are provided in a conventional array 12, as shown in FIG. 2, which serves as an open frame for transporting the boards through the SMT line. In particular, two circuit boards 14,16 are provided in each array 12 for exposing the surfaces thereof to the SMT process. In practice a continuous flow of such arrays are passed one after the other through the SMT production line 10. According to the invention, two or more circuit boards, at least one top side up and at least one bottom side up, are provided in the array 12. More particularly, FIG. 2(A) shows one side (side 1) of the array 12, which exposes the primary side (top) of board 14 and the secondary side (bottom) of board 16 to the SMT process. FIG. 2(B) shows the other side (side 2) of the array 12, which exposes the top of board 16 and the bottom of board 14 to the SMT process.

The SMT production line 10 includes a number of line sections, which are described as follows in relation to the production operation. The arrays 12 arrive either in magazines, which are unloaded in a magazine unload section 20, or as separate arrays in a bare board load section 22. A solder paste is applied through a stencil in a solder paste print section 24. The solder paste acts partially as an adhesive (before reflow soldering), and its surface tension helps to align parts during soldering. Next the boards are populated with smaller electronic components in a chip placement section 26, and with larger electronic components in a large IC placement section 28. Both sections 26 an 28 pick and place the respective parts into the solder paste. A pre-reflow inspection operation 30 checks the work, and the parts are secured to the conductive lands on the boards in a reflow solder section 32. After reflow soldering, the parts are again inspected and, if necessary, reworked in a post reflow inspection and repair operation 34. Thereafter the unfinished singled-sided (first pass) boards are flipped end-to-end in a board flipping section 36 and loaded into magazines in a magazine load section 38, while the finished double-sided (second pass) boards are passed through to an incircuit test and repair section 40. Finally the finished boards are separated from the arrays 12 in a separation section 42 and sent to subsequent assembly operations (which are not part of this invention). All sections in the production line 10 as heretofore described are conventional SMT operations, employing conventional SMT machinery.

Figure 3:
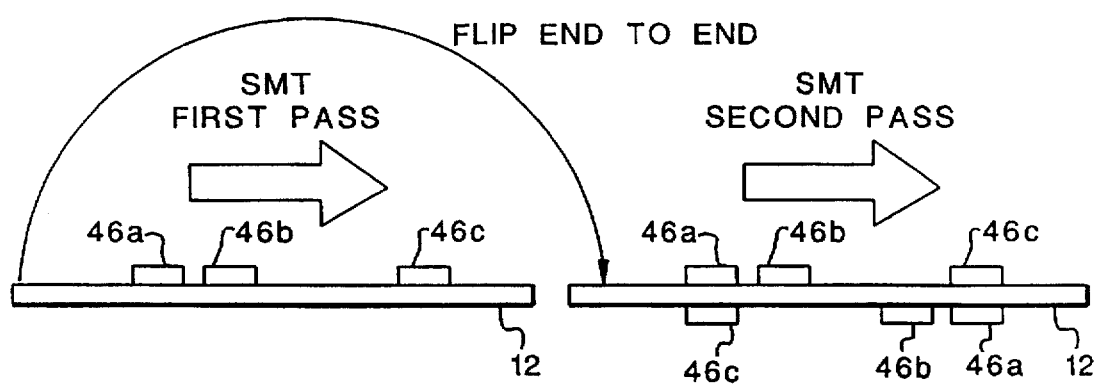
FIG. 3 is an illustration of the process of flipping an array end to end in order to populate the other sides of the circuit boards provided in the array.

The benefit of the invention is obtained by returning the first pass boards through a return path 44 to the input stream of the SMT process, where the boards are unloaded in the magazine unload section 20 and again placed on the production line 10. Before entering the input stream, each array 12 is flipped end to end as shown in FIG. 3 in the board flipping section 36. While shown as a separate section 36, board flipping may occur in the magazine load section 38, anywhere in the return path 44, or in the magazine unload section 20. The boards can be flipped manually e.g., by flipping the magazines, or by a conventional board flipping apparatus (which is conventionally used between two separate lines). Importantly, since the device locations on the respective boards 14,16 remain unchanged in relation to the array 12, no change is necessary in any of the sections of the production line 10 to complete the second pass. For instance, as shown in FIG. 2(A), parts 46a, 46b and 46c are attached to the top side of board 14 and to the bottom side of board 16 in the first pass. When the array is flipped, as shown in FIG. 2(B), the top side of board 16 and the bottom side of board 14 are populated in the second pass through the SMT production line 10 with the parts 46a, 46b and 46c attached to the boards 14,16 in the same places as in the first pass.

Consequently, by creating a two-up array, that is, at least two boards in a panel (there can be more than two as long as it is a multiple of two) where the top of one board and the bottom of the other board face up in the array, the boards are processed through the line the first time, populating the top of board 14 and the bottom of the other board 16 on the first pass of the array. Then, by flipping the array over and running through the second pass with no change over required, the bottom of the one and the top of the other board are populated. Once enough arrays/boards have run through the line the first time to "prime the pump", flipped (second pass) and unflipped (first pass) arrays can be interspersed into the input stream to the SMT line. For example, alternate arrays (first pass, second pass, first pass . . . ) can be run. By thus establishing an intermittent flow of finished circuit assemblies in the output stream of the second pass through the surface mount process, this give two boards in an array that are completed as every other array comes through the SMT process. The results are: no change over time, no batch set up, only one SMT line is required, and finished boards are continually available off the line for testing and insertion into product.

If the product being built has multiple boards, then an array is made up with board sets using the same concept. For example, if there are three boards in the product, an array is made up with one each of the three boards facing up and a mirror image of the same three facing down.

The invention has been described with reference to a preferred embodiment. However, it will be appreciated that variations and modifications can be effected by a person of ordinary skill in the art without departing from the scope of the invention.

PARTS LIST

10 SMT production line
12 array
14 circuit board
16 circuit board
20 magazine unload section
22 bare board load section
24 solder paste print section
26 chip placement section
28 large IC placement section
30 pre-reflow inspection
32 reflow section
34 post-reflow inspection and repair operation
36 board flipping section
38 magazine load section
40 incircuit test and repair section
42 separation section
44 return path
46a, 46b, 46c parts

What is claimed is:

1. A method for manufacturing double-sided circuit assemblies by a surface mount process, said method comprising the steps of:

arranging the circuit assemblies in arrays so that two or more circuit assemblies, at least one top side up and at least one bottom side up, are provided in each array;

placing electrical components on one side of the circuit assemblies in a first pass of the arrays through the surface mount process;

flipping each array over; and placing electrical components on the other side of the circuit assemblies in a second pass of the flipped arrays through the same surface mount process.

2. The method as claimed in claim 1 wherein the step of placing electrical components on the other side of the circuit assemblies in a second pass further comprises the steps of:

interspersing unflipped and flipped arrays into the input stream of arrays to the second pass through the surface mount process;

placing electrical components on the one side of the circuit assemblies in the unflipped arrays and the other side of the circuit assemblies in the flipped arrays in the second pass of the arrays through the surface mount process in order to establish an intermittent flow of finished circuit assemblies in the output stream of the second pass through the surface mount process.

3. The method as claimed in claim 2 wherein the step of interspersing arrays comprises alternating unflipped and flipped arrays.

4. The method as claimed in claim 1 wherein the step of arranging the circuit assemblies comprises arranging two circuit assemblies in each array, one circuit assembly top side up and the other circuit assembly bottom side up.

5. The method as claimed in claim 1 wherein the circuit assemblies are circuit boards.

6. A method for manufacturing double-sided circuit assemblies by a surface mount process, said method comprising the steps of:

arranging the circuit assemblies in arrays so that two or more circuit assemblies, at least one top side up and at least one bottom side up, are provided in each array;

inserting original arrays into an input stream of the surface mount process in an initial first pass of the arrays through the process;

placing electrical components on one side of the circuit assemblies in the first pass of the original arrays through the surface mount process;

flipping each array over;

interspersing original and flipped arrays into the input stream of arrays in a continuing pass of the arrays through the surface mount process; and placing electrical components on the one side of the circuit assemblies in the original arrays and the other side of the circuit assemblies in the flipped arrays in the continuing pass of the arrays through the surface mount process in order to establish an intermittent flow of finished circuit assemblies in the output stream of the surface mount process.

7. The method as claimed in claim 6 wherein the circuit assemblies are circuit boards.

8. The method as claimed in claim 6 wherein the step of interspersing arrays comprises alternating original and flipped arrays.

* * * * *